Dec. 10, 1963 R. H. FREEDMAN ETAL 3,114,113

VARIABLE STABLE FREQUENCY STANDARD

Filed Sept. 20, 1961 2 Sheets-Sheet 1

INVENTORS
ROBERT FREEDMAN
RICHARD FREEDMAN
BY Eugene S. Lovette
ATTORNEY

Dec. 10, 1963 R. H. FREEDMAN ET AL 3,114,113

VARIABLE STABLE FREQUENCY STANDARD

Filed Sept. 20, 1961 2 Sheets-Sheet 2

INVENTORS
ROBERT FREEDMAN
RICHARD FREEDMAN
BY Eugene S. Lovette
ATTORNEY

United States Patent Office 3,114,113

Patented Dec. 10, 1963

3,114,113
VARIABLE STABLE FREQUENCY STANDARD

Robert H. Freedman, 23 Seafield Lane, Bay Shore, N.Y., and Richard C. Freedman, 6 Daniel Road S., Massapequa, N.Y.

Filed Sept. 20, 1961, Ser. No. 139,437
1 Claim. (Cl. 331—19)

This invention relates to a method and apparatus for achieving a variable stable frequency standard and, in particular, a frequency standard wherein the output of oscillator means is fed to a frequency counter and wherein desired stability is obtained by controlling the drift of the frequency from the equivalent of a predetermined frequency and resetting the oscillator accordingly.

It is a principal object of this invention to provide a method for providing a highly stable frequency standard and the apparatus for achieving same by operating an oscillator in conjunction with a frequency counter. Any digit of the selected frequency may be set digitally thus giving a digital controlled oscillator rather than an analog controlled oscillator. The output of the oscillator is fed into the frequency counter. In accordance with the invention, a high degree of stability is achieved upon regulating or controlling the drift read on the frequency counter and resetting the oscillator accordingly. In accordance with the invention, regulation of the drift is effected by sensing the frequency counter with respect to a preset voltage divider and thus resetting the oscillator. This regulation may be accomplished automatically. The end result is a closed loop in which any error, if existing, is fed back to the oscillator to correct its frequency automatically. Both accuracy and stability of the frequency standard is depended upon the accuracy and stability of the time base used in the frequency counter.

Further objects and advantages will become apparent from the description of the invention taken in conjunction with the figures, in which.

Figure 1:
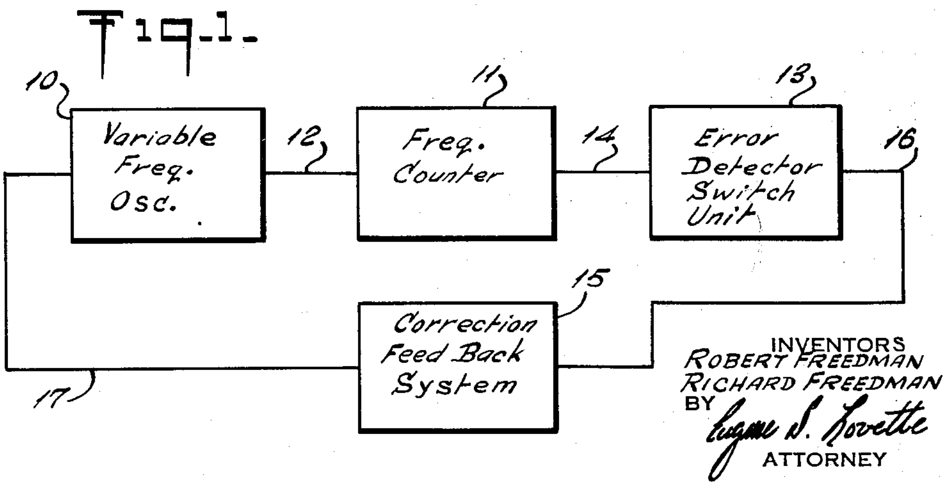
FIG. 1 illustrates schematically a closed loop block diagram of a highly stable variable frequency standard in accordance with the invention.

Reference is now made to the figures wherein, FIG. 1 indicates a block diagram of the variable frequency standard in accordance with the invention. A variable frequency oscillator 10 is used to provide a selected frequency. The output of oscillator 10 is fed into a suitable frequency counter 11 through lead wire 12. The frequency counter is a very accurate instrument capable of reading an input frequency. By varying the time base setting of frequency counter 11, its time of counting and its display time may be varied. If a time base of one second is used, the frequency counter will count the input frequency in one second and it will display its resultant figures on the front panel for the next second. A system of switches 13 includes a ten step switch, whereby the equivalent of a desired number in a particular digit may be preset. To obtain an indication of an error, if one exists, between the preset digit and the actual number of the digit as read on the frequency counter 11, a choice of methods may be used. Photoelectric cells may be placed operatively alongside the numbers on the frequency counter 11 and during its display time, as that number lights up, the adjacent photoelectric cell would be activated. This response may be compared with the present voltage. Another method makes use of the staircase voltage contained in the frequency counter. The staircase voltage involves a series of ten voltage steps approximately ten volts apart. These steps vary inversely with voltage from +150 volts D.C. to +50 volts D.C., so that step 0 is 150 volts, step 1 is about 140 volts, step 2 is about 130 volts, etc. The staircase voltage may be compared with the preset voltage of the ten step switch by means of lead wire 14. If an error exists, appropriate switching occurs which activates a correction feedback system 15 through lead line 16. This correction system may be effected either with motor means or through ratchet switches which change the L, C or R of the oscillator tuned circuit 10. A more logical and faster method, would be the use of a reactance tube or a "varicap" controlled by the voltage difference between the preset voltage of the ten step switch and the staircase voltage. The difference voltage is the error voltage. The correction signal from correction system 15 is fed through lead wire 17 back to oscillator 10 to complete the closed loop circuit.

Figure 2:
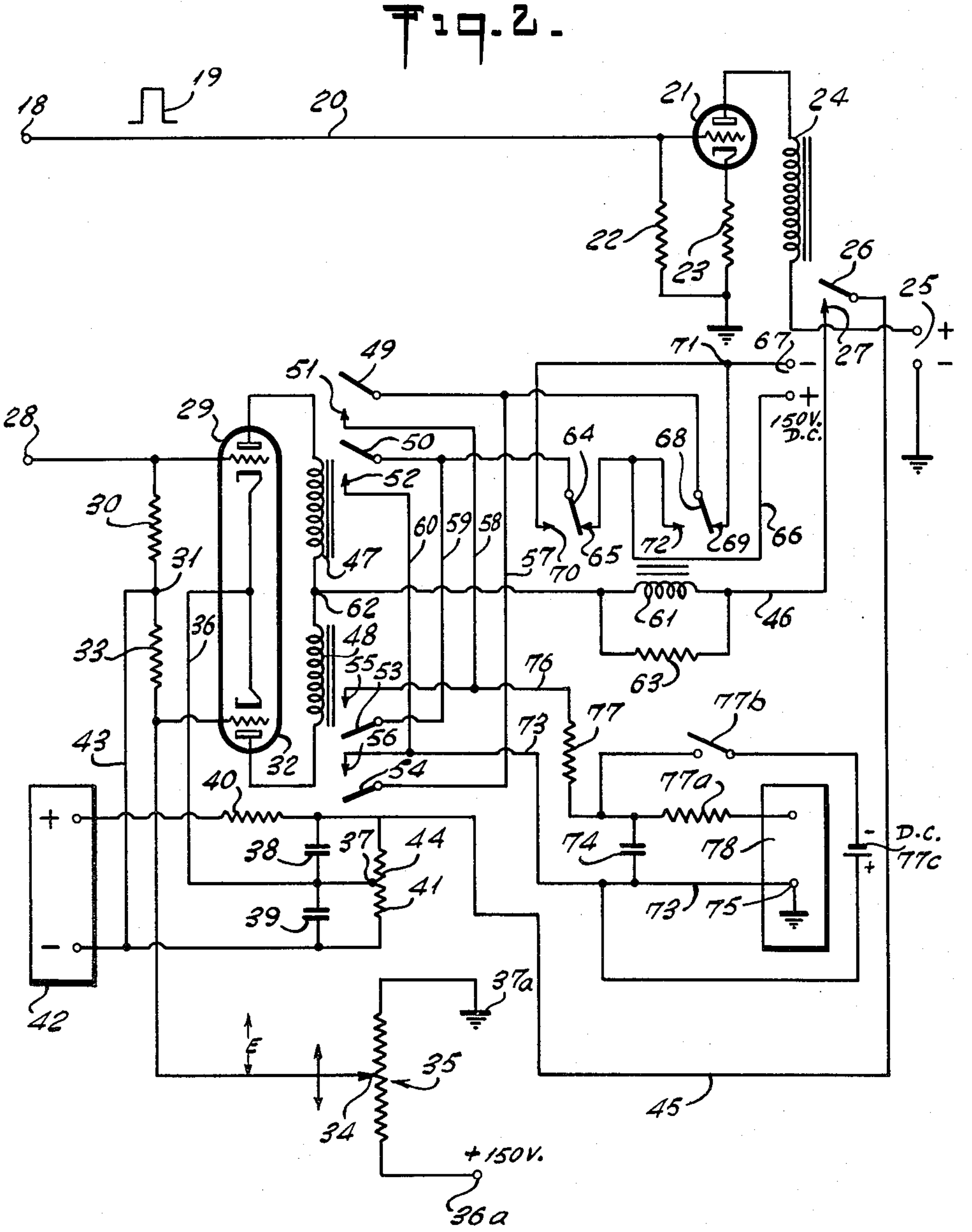
FIG. 2 illustrates schematically the error detection unit including its system of switches in accordance with the invention.

For the system of switch 13, any number of devices could be used, e.g. transistor switches, relays or pulse transformers. In FIG. 2, relays are used to complete error detection unit 13. Point 18 is connected to frequency counter 11 to cause the detection unit relays to operate only during the display period of the frequency counter and not during its counting cycle. The aforesaid connection synchronizes detection unit 13 with the time base of counter 11. An input signal, depicted as a pulse 19, passes through wire 20 to the grid of a ½ 12 AU7 tube 21 during the display time of counter 11. A 1 meg. resistor 22 acts as the grid resistor between the tube grid and ground. The cathode of tube 21 is biased by means of 1K resistor 23 connected between cathode and ground. The plate circuit of tube 21 includes the coil of a relay 24 and a B+ supply of 150 volts D.C. 25. As pulse 19 passes through tube 21, relay 24 is activated to cause its switch blade 26 to make contact with contact point 27.

The output staircase voltage from the frequency counter 11 is connected to the circuit of unit 13 by contact 28 which leads to the grid of the upper 12 AU7 tube 29. The grid resistor for tube 29 is a 1 meg. resistor 30 connected between the grid of tube 29 and a junction 31. The other half of the 12 AU7 tube 32 also has a 1 meg. grid resistor 33 connected between the grid of tube 32 and junction 31. The grid of tube 32 is also connected to a variable tap 34 along a ten step voltage divider 35. Ten step voltage divider 35 is connected between a +150 volt D.C. supply 36*a* and ground 37. The 150 volts 36 could be paralleled across voltage supply 25 serving tube 21. Ten step voltage divider 35 is used to preset the number of the digit which is desired to be standardized. Divider 35 is calibrated whereby each of its ten steps correspond to the individual ten steps of the staircase voltage in the frequency counter 11 so when the digit number 0 is desired, the voltage between 34 and 37 is 150 volts; for the digit number 1, this voltage would be 140 volts; and for digit number 2, the voltage is 130 volts, etc.

The cathodes of tubes 29 and 32 are connected together and are likewise connected by wire 36 to junction 37. Biasing for tubes 29, 32 is provided by a voltage divider consisting of 10K and 2K resistors, 44, 41, respectively. Grid return junction 31 is negative 20 volts with respect to cathode junction 37 while lead wire 45 is positive with respect to the cathodes. A power supply 42 is connected to junction 31 through a wire 43. Resistor 40 and capacitors 38, 39 form a filter for power supply 42. The biasing is so adjusted whereby tubes 29, 32 are normally cut off, but are capable of operating well into their operating range. The grids are adjusted to about −20 volts and are thus free to swing ± 10 volts. Power supply 42 also provides the B+ for tubes 29, 32 through a wire 45 to switch blade 26 and point contact 27 of relay 24, and then through a wire 46 to the plates of tubes 29, 32.

Thus, when the frequency counter time base is synchronized to the circuit of unit 13 through connection 18, a pulse 19 will pass through tube 21 during the counter display time which will energize relay 24 and cause blade 26 to close contact with 27, which will connect wire 45 with wire 46 so that the plates of tubes 29, 32 are provided with B+ from power supply 42. Then, if there is voltage difference between the voltage preset on ten step voltage divider 35 and the staircase voltage of frequency counter 11, this voltage difference will appear between the two grids of tubes 29, 32. For example, if the frequency drifts whereby the staircase voltage at terminal 28 increases in value and thus becomes greater than the preset voltage at junction 34, tube 29 is driven to conduct whereas tube 32 remains in a non-conducting status. On the other hand, if the drift is such that staircase voltage at terminal 28 drops below the preset voltage at junction 34, then tube 32 is driven to conduct whereas tube 29 remains in a non-conducting status. In no situation do both tubes 29, 32 conduct at the same time. If the input staircase voltage at 28 equals the preset voltage at 34, tubes 29, 32 remain in non-conducting status.

The plate circuit of tube 29 includes a coil of a relay 47. Similarly, the plate circuit of tube 32 includes a coil of a relay 48. When tube 29 conducts, relay 47 is activated causing its switch blades 49, 50 to make contact with the individual contact points 51, 52. When tube 32 is conducting, relay 48 is activated and switch blades 53, 54 make contact with the individual contact points 55, 56. Switch 49 is connected with switch 54 through a wire 57. Switch 50 is connected to switch 53 through a wire 59. Similarly, contact point 51 is connected to contact point 55 through a wire 58 and contact point 52 is connected to contact point 56 through a wire 60.

A coil of a relay 61 is in the plate circuit of both tubes 29, 32 and it is connected to a junction 62. Relay coil 61 is in parallel with an 8 ohm resistor 63 which is connected to wire 46. The parallel circuit involving relay 61 is calibrated, whereby relay 61 is only activated when a difference voltage between the preset and the staircase voltage is at least about 50 volts. This causes the conducting tube 29 or 32 to draw enough current to energize relay 61. Its purpose is to change the polarity of the correction voltage. If it is desired to hold the last digit of a certain frequency to zero and if the counter digit drifts up to 1, then the error voltage would cause tube 32 to conduct to reduce the frequency. However, if the last digit drifts to 9 with the adjacent digit likewise decreasing one whole number, and since we are scanning merely the last digit, the circuit would sense an increase from zero to nine instead of the actual decrease of one, whereby tube 32 would conduct to attempt to decrease the frequency instead of providing a needed increase in frequency. For this reason, relay 61 is provided to reverse the polarity of the output correction signal and thus actually causes an increase in frequency as is necessary.

The foregoing regulation is accomplished by means of the following circuit. Relay 61 includes a switch blade 64 which is connected to both switches 50, 53. Switch blade 64 is normally in contact with contact point 65 which is fed through a wire 66 to the positive side of 150 volts D.C. source 67. Relay 61 also includes a switch blade 68 which is connected to switches 49, 54. Switch blade 68 is normally in contact with contact point 69 which is connected to the negative side of 150 volts D.C. source 67. Contact point 70 of relay 61 is joined at junction 71 to the negative side of source 67, and contact point 72 is connected to the positive side of source 67. When sufficient voltage is supplied so as to activate relay 61, switch 64 will move to break contact with point 65 to make contact with point 70. At the same time, switch 68 will move from point 69 to make contact with point 72 thus changing polarity of the correction signal.

The ends of contact points 52, 56 are connected by wire 73 to one end of a 10 $\mu$f. capacitor 74 and ground 75. Contact points 51, 55 are connected by line 76 which contains a 100 megohm series resistance 77 (to limit the charging rate per pulse) to the other end of capacitor 74. Capacitor 74 stores the charge conveyed to it by relays 61, 47 and 48 and then feeds the polarized corrective signal to the correction unit, i.e., a reactance tube or "varicap" 78, which either increases or decreases the oscillator frequency in the direction to maintain stability of the oscillator frequency. When a new frequency is set, switch 77*b* is closed momentarily to apply a negative voltage of 20 volts provided by source 77*c* to bias "varicap" 78. A 100 megohm resistor 77*a* serves to prevent capacitor 74 from discharging through the "varicap" 78 in the oscillator. It also divides the voltage increments per pulse so that there is no overcorrecting.

The disclosed system contemplates a time base of one second. Oscillator 10 of necessity had a stability of its own of one cycle per second per second, which means scanning only the last digit to standardize same every other second. If frequency of one megacycle is used, the invention provides an accuracy and stability one part in 10 to the sixth. In general, by varying the time base, the accuracy and stability will be dependent only upon the accuracy and stability of the frequency counter itself.

If all the digits of a frequency are to be checked out and stabilized, individual circuits of switches as shown in FIG. 2 may be employed for each digit. However, since the first few digits are very little affected by drift, fixed capacitors could be used to adjust the frequency followed by individual voltage dividers, as described in the previous circuit, for the last few digits. If economy were a factor, it would also be possible, by using stepping switches, electronic or electro-mechanical, to periodically scan all the digits of the preset frequency and determine if there is an error, always starting with the higher digit and then working back. If there is an error in any one digit, the stepping switches would stop and a correction would then be made until there is no error in that digit. The stepping switch would then proceed to the last digit of the number, remain there for a while and then repeat the whole sequence. This procedure would only take place immediately after a new frequency setting has been made or if the equipment was inadvertently turned off for a short length of time.

This invention may be employed wherever a fixed frequency standard is required. In addition, the equipment may be programmed so that frequencies may be shifted every minute with high accuracy. As an example, such application may involve testing of filters, testing of telemetry devices, variable frequency broadcasting, wherein this invention would be useful.

Figure 3:
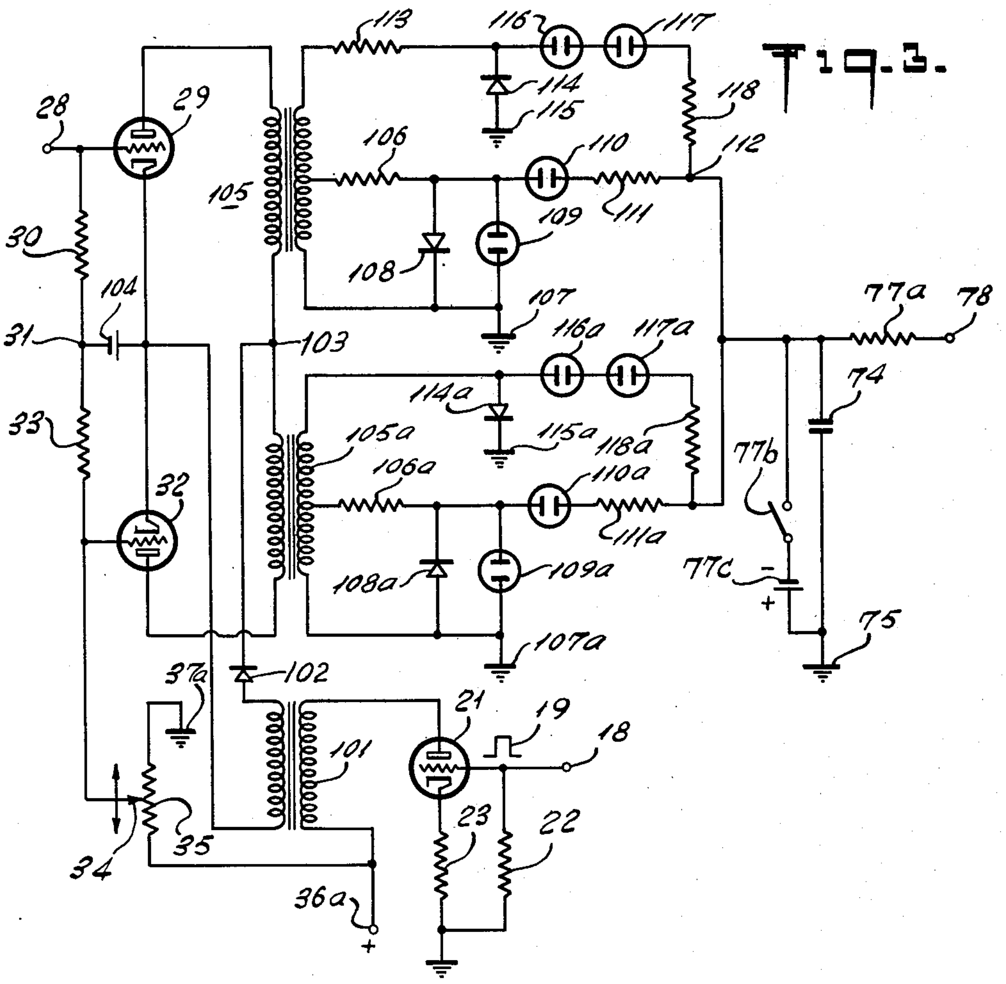
FIG. 3 illustrates another embodiment of the error detection unit.

FIG. 3 shows another circuit for an error detection unit 13. This particular circuit uses pulse transformers and gas tubes to accomplish switch regulation. The desired digit is preset through the ten step voltage divider switch exactly as in FIG. 2. The ten step divider switch 35 has one end 37 grounded and the other ends 36*a* connected to the positive side of a 150 v. D.C. power supply. The trigger for this circuit is synchronized with frequency counter 11 as in FIG. 2. Pulse 19 enters 18 and passes to the grid of tube 21. Grid resistor 22 is between the grid of tube 21 and ground. The cathode resistor 23 is between the cathode of tube 21 and ground. The plate circuit of tube 21 includes the primary of a pulse transformer 101. The secondary of pulse transformer 101 passes through a rectifier 102 to a junction 103. The other end of the secondary of pulse transformer 101 goes to the joined cathodes of tubes 29, 32.

Tubes 29, 32 are the same as those in FIG. 2 serving the same purpose with the same biasing. The output from the staircase voltage of frequency counter 11 enters the circuit at point 28. The grid resistor 30 of tube 29 is between the grid of tube 29 and junction 31. The grid resistor 33 is between the grid of tube 32 and junction 31. The biasing arrangement is similar to that of FIG. 2, however, it is simplified for illustration purposes and is depicted by a power supply 104 placed between junction 31 and the joined cathodes of tubes 29, 32.

Once again, the biasing is arranged whereby tubes 29, 32 are cut off. When freqency counter 11 is undergoing its display time, pulse 19 enters at 18 and passes through tube 21 into pulse transformer 101. Rectifier 102 permits only positive pulses to pass which provides the B+ for tubes 29, 32. The staircase voltage from frequency counter 11 then enters at 28. If this is the same as the preset voltage at 34, tubes 29, 32 remain cut off. If the voltage at 28 is greater than junction 34, then tube 29 will conduct. If the voltage at 28 is less than voltage at 34, then tube 32 will conduct.

The plate circuit of tube 29 includes the primary of a pulse transformer 105. Pulse transformer 105 has a split secondary. The output of a pulse transformer is a series of pulses which can either be considered negative pulses or positive pulses depending on which part is grounded. The split secondary of pulse transformer 105 has a series resistor 106 connected to a center tap of the secondary. A rectifier 108 and a gas tube 109 are shunted between the other end of resistor 106 and ground 107. The end of resistor 106 is also connected to a gas tube 110 and series resistor 111 to a junction 112. The top half of the split secondary of pulse transformer 105 is connected to a series resistor 113. A rectifier 114 is shunted between the other end of resistor 113 and ground 115. The end of resistor 113 is also connected to two identical gas tubes 116, 117 connected in series, which in turn connects to junction 112 through a resistor 118.

When a pulse passes into tube 21, it provides the B+ for tubes 29, 32. If the staircase voltage of the frequency counter drifts to increase above that preset at point 34, then tube 29 will go on. This increase of voltage in the staircase indicates a lower digit number than the preset number, as explained with reference to FIG. 2. In this case, with tube 29 energized, a pulse will appear across each half of the secondary of transformer 105 of about 100 volts. This voltage will appear across resistors 106, 113. The polarity of rectifier 108 is so arranged that the negative side is grounded, whereby it will short circuit all positive pulses to ground. On the other hand, a negative pulse will appear across gas tube 110. This tube 110 has a breakdown voltage of about 50 volts which will leave a negative pulse of 50 volts to continue through resistor 111 to junction 112. This results in a negative pulse signal to charge capacitor 74 which then feeds the polarized corrective signal to the "varicap" 78. The resistor 111 as well as all resistors following the gas tubes are to limit the charging time of the pulse. The gas tube 109 is a VT 150 tube which needs 150 volts to break down and thus in this instance tube 109 will not conduct. In the top half of this circuit, tubes 116, 117 have breakdown voltages of 100 volts each and since there is only about 100 volts from the secondary, there will not be any pulse in the top half of the circuit to continue on to resistor 118.

As brought out in connection with FIG. 2, if the preset voltage is equivalent to 999.999 kc. and the staircase voltage increases to 1000.000 kc., this is actually an increase of one cycle. However, since we are scanning only the last digit, it will appear as a decrease of 9 cycles instead of an actual increase of one cycle. Since the staircase voltage is inversely proportional to the digit number, there will be about 900 volts appearing across the secondary of the split transformer 105. Rectifier 108 will insure that the 900 volt pulse is a negative pulse. However, tube 109 will break down at 150 volts and will act as a voltage regulator insuring only a 150 volt negative pulse to continue on to tube 110. Tube 110 breaks down with 50 volts giving a 100 volt negative pulse at junction 112. However, rectifier 114 will short out negative pulses, thus providing 900 volt positive pulse across the tubes 116, 117. Each of these tubes use 100 volts for breakdown, thus given a 700 volt positive pulse through resistor 118 to junction 112 with a resultant of a positive 600 volt pulse at said junction. As a result, a positive pulse signal is now passed on to "varicap" 78 to drive the frequency down. Thus, this circuit provides for a reversal of polarity at junction 112 if the circumstances require it.

The plate of tube 32 is provided with a similar circuit arrangement in the secondary of its transformer 105*a*. For this reason, like units in the secondary circuit of transformer 105*a* have corresponding reference numbers followed by the suffix *a*. The only difference is that rectifiers 108*a* and 114*a* have been reversed. Tube 32 will fire when the staircase voltage drops as compared with the preset. Here again, arrangement has been made to provide a reversal of polarity when circumstances warrant it, as described previously. All the series resistors 113, 106, 113*a* and 106*a* may be identical as well as all charging time resistors 118, 111, 118*a* and 111*a*. The junctions 112 and 112*a* feed into condenser 74 and a resistor 77*a* to regulate the voltage entering "varicap" 78. This arrangement is similar to that of FIG. 2.

It is intended that all matter contained in the above description or shown in the accompanying drawings shall be interpreted as illustrative and not in a limiting sense.

What is claimed is:

A system for providing an electrical frequency standard comprising, oscillator means for providing an output electrical signal, frequency counter means for measuring and indicating the frequency of said output electrical signal, means for providing a first electrical signal which is a function of the frequency measured and indicated by said counter, means for providing a preset electrical signal which is a function of a frequency equal to a desired frequency, means for comparing said first electrical signal against said preset electrical signal and for providing an error signal which error signal is a function of the difference between said first electrical signal and said preset signal, said error signal having alternative polarity depending whether the frequency measured and indicated by said counter is greater than or less than the desired frequency represented by said preset signal, and means responsive to said error signal including the polarity thereof for tuning said oscillator to regulate its output electrical signal frequency to equal said desired frequency.

References Cited in the file of this patent

UNITED STATES PATENTS

| | | |
|---|---|---|
| 2,005,153 | Marks | June 18, 1935 |
| 2,490,404 | Bliss | Dec. 6, 1949 |
| 2,540,167 | Houghton | Feb. 6, 1951 |
| 2,627,033 | Jensen et al. | Jan. 27, 1953 |